United States Patent
Weldon et al.

(10) Patent No.: US 6,899,798 B2
(45) Date of Patent: May 31, 2005

(54) REUSABLE CERAMIC-COMPRISING COMPONENT WHICH INCLUDES A SCRIFICIAL SURFACE LAYER

(75) Inventors: Edwin Charles Weldon, Los Gatos, CA (US); Yongxiang He, Sunnyvale, CA (US); Hong Wang, Cupertino, CA (US); Clifford C. Stow, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 247 days.

(21) Appl. No.: 10/027,683

(22) Filed: Dec. 21, 2001

(65) Prior Publication Data

US 2003/0116276 A1 Jun. 26, 2003

(51) Int. Cl.[7] .......................... C23C 14/35; C23C 16/00
(52) U.S. Cl. .................... 204/298.11; 204/298.02; 118/715; 118/720; 118/721; 118/729; 156/345.3; 156/345.43
(58) Field of Search ............... 204/298.11, 298.02; 118/715, 720, 721, 729; 156/345.3, 345.43

(56) References Cited

U.S. PATENT DOCUMENTS

| 4,822,633 A | 4/1989 | Inoue |
| 5,558,789 A | 9/1996 | Singh |
| 5,703,341 A | 12/1997 | Lowndes et al. |
| 5,897,752 A * | 4/1999 | Hong et al. ............ 204/192.12 |
| 6,620,520 B2 * | 9/2003 | O'Donnell et al. ......... 428/469 |

FOREIGN PATENT DOCUMENTS

| DE | 4235333 | 3/1994 | ............. G03F/7/00 |
| JP | 06024878 | 2/1994 | ........... C04B/41/88 |

OTHER PUBLICATIONS

C. I. Helgesson, Ceramic–to–Metal Bonding, Boston Technical Publishers: Cambridge, MA, pp. 7–21 (1908).

* cited by examiner

Primary Examiner—Rodney G. McDonald
(74) Attorney, Agent, or Firm—Shirley L. Church (57) ABSTRACT

Disclosed herein is a method of roughening a ceramic surface by forming mechanical interlocks in the ceramic surface by a chemical etching process, a thermal etching process, or a laser micromachining process. Also disclosed herein are components for use in semiconductor processing chambers (in particular, a deposition ring for use in a PVD chamber) which have at least one ceramic surface having mechanical interlocks formed therein by chemical etching, thermal etching, or laser micromachining. Ceramic surfaces which have been roughened according to the chemical etching, thermal etching, or laser micromachining process of the invention are less brittle and damaged than ceramic surfaces which are roughened using conventional grit blasting techniques. The method of the invention results in a roughened ceramic surface which provides good adherence to an overlying sacrificial layer (such as aluminum).

16 Claims, 4 Drawing Sheets

REUSABLE CERAMIC-COMPRISING COMPONENT WHICH INCLUDES A SCRIFICIAL SURFACE LAYER

BACKGROUND OF THE INVENTION

1. Field of the Invention

The present invention pertains to methods of roughening a ceramic surface in order to promote adherence of a material applied over the ceramic. The invention also pertains to components for use in semiconductor processing equipment which include roughened ceramic surfaces.

2. Brief Description of the Background Art

Figure 1:
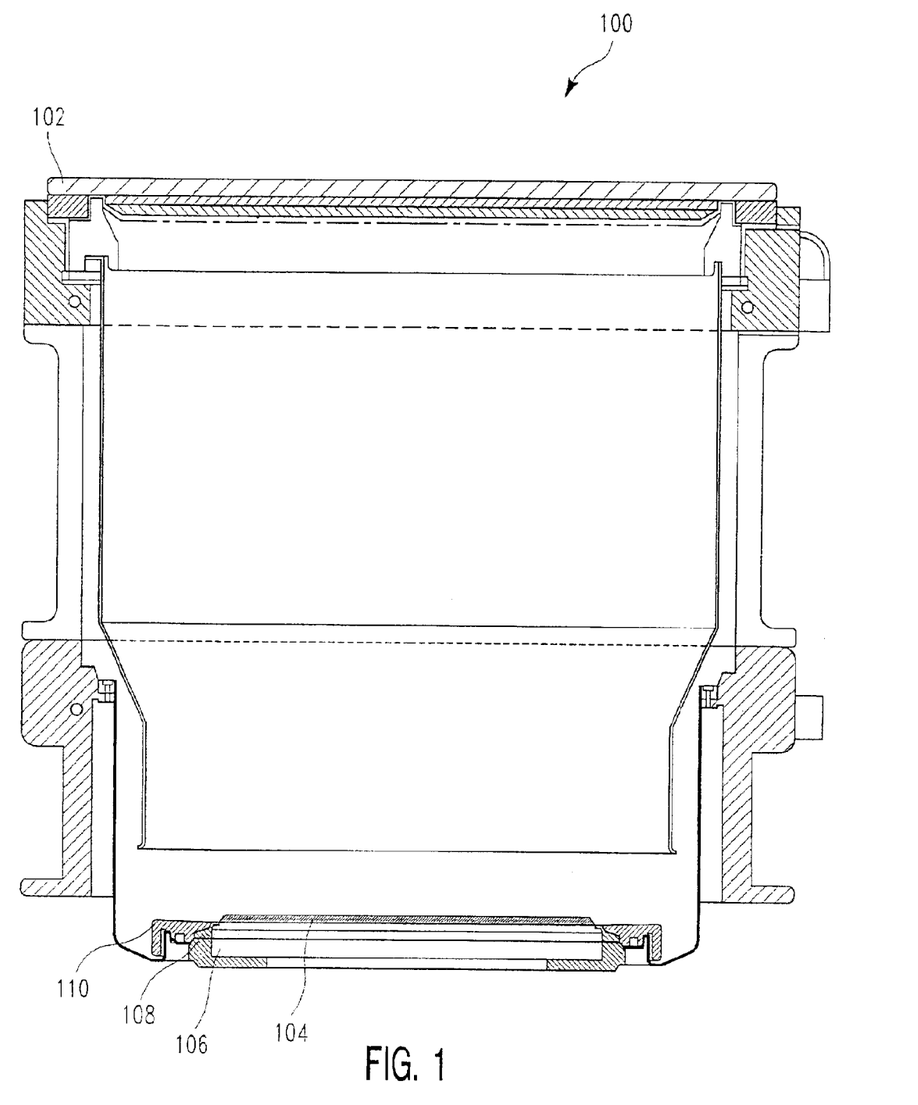
FIG. 1 shows a cross-sectional schematic of a physical vapor deposition (PVD) processing chamber 100.

In semiconductor device manufacturing, physical vapor deposition (PVD) is a process which is frequently used to deposit a layer of material onto a substrate. FIG. 1 shows a cross-sectional schematic of a PVD processing chamber 100. During a PVD process, a plasma (such as an argon plasma) is used to sputter material (such as copper or tantalum) from a target 102 onto the surface of a semiconductor substrate 104 (typically a silicon wafer), which sits atop an electrostatic chuck 106. A deposition ring 108 is positioned over the exposed upper surface of the chuck 106 which extends beyond the outer edge of semiconductor substrate 104, in order to protect the chuck from depositing materials. Deposition ring 108 is typically made of a ceramic material such as aluminum oxide, so that the linear thermal expansion of the deposition ring 108 will be the same as the aluminum oxide surface of the electrostatic chuck 106. A cover ring 110 encircles the outer edge of deposition ring 108. The cover ring 110 is typically made of a metal, such as titanium.

During copper metallization processes, a layer of tantalum is frequently deposited onto the substrate 104 as a wetting layer to facilitate subsequent copper deposition. During tantalum deposition (and also during chamber warm-up operations, when a tantalum target is in the chamber), tantalum is sputtered onto the deposition ring 108, as well as the substrate 104. The ceramic surface of the deposition ring 108 is roughened so that the depositing tantalum will adhere to the surface of the deposition ring 108 and will not flake off and contaminate the chamber. Roughening of the ceramic surface of the deposition ring is typically performed by grit blasting using silicon carbide particles.

At some point, the tantalum build-up must be removed from the deposition ring 108, before the amount of deposition becomes so great that the tantalum bridges across to surfaces adjacent the deposition ring 108 and creates an electrical pathway between the metal cover ring 110 and the semiconductor substrate 102. However, tantalum is highly resistant to chemical etchants and is not easily removed by conventional means.

Figure 2A:
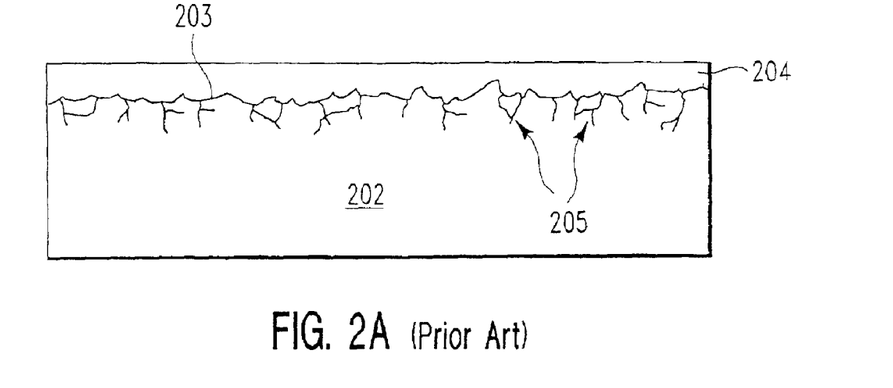
FIGS. 2A–2C illustrate the build-up of a tantalum layer 206 on the surface of a sacrificial aluminum layer 204 and the subsequent separation of the tantalum layer 206 and aluminum layer 204 from the roughened ceramic surface 202, which increases microcracking 205 of the ceramic surface.
Figure 2B:
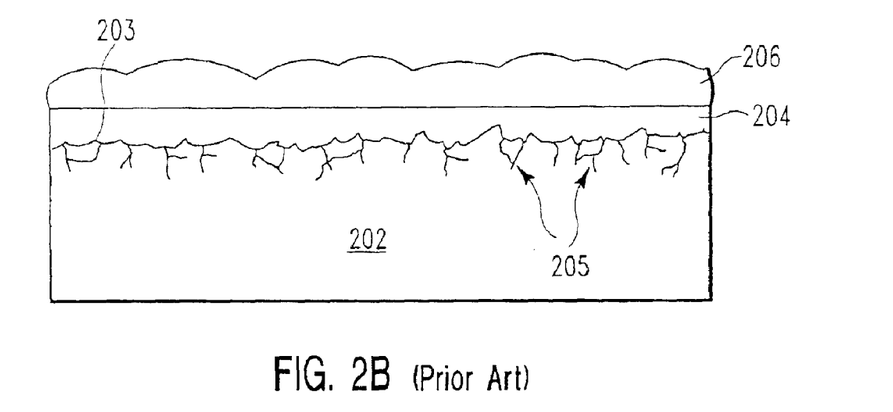
Figure 2C:
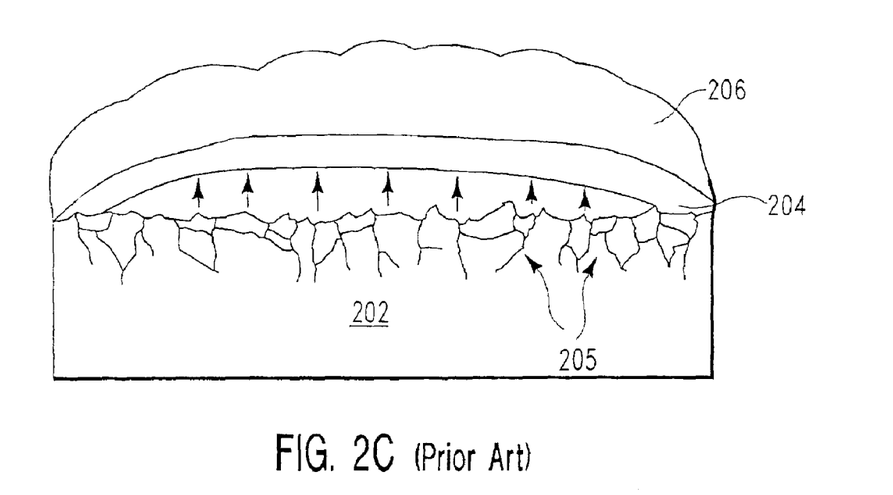

Referring to FIG. 2A, one approach to provide for tantalum removal involves coating the roughened surface 203 of the ceramic deposition ring 202 with a sacrificial layer of aluminum 204. FIG. 2B shows the surface 203 of the ceramic deposition ring 202 as a layer 206 of tantalum starts to build up over sacrificial aluminum layer 204. The aluminum layer 204 can be easily dissolved away (e.g., by dipping in an acid bath), taking the overlying deposited tantalum 206 with it (not shown). However, as the tantalum layer 206 builds up during semiconductor processing operations, it pulls on the underlying sacrificial aluminum layer 204, causing the aluminum layer 204 to separate from the surface 203 of ceramic deposition ring 202, as shown in FIG. 2C. This usually results in flaking off of the dual layer of tantalum 206 and aluminum 204.

Although the nature of this failure is currently not well understood, initial observations indicate that the failure occurs close to the interface 203 between the sacrificial aluminum layer 204 and the ceramic deposition ring 202, and not deep within the aluminum layer. It is therefore believed that surface properties of the ceramic are a major contributing factor in the observed failures.

The adherence of the aluminum layer 204 to the underlying ceramic surface 203 is principally determined by the tensile strength of the ceramic matrix (which affects cohesive strength) and the surface morphology of the ceramic (which affects surface adherence). Roughening of the ceramic surface 203 by diamond tool grinding is known to create microcracks 205 in the first few microns of the ceramic surface, thereby reducing the tensile strength of the ceramic matrix and increasing the brittleness of the ceramic, subjecting the ceramic material to cohesive failure when the overlying sacrificial aluminum layer 204 places stress on the surface 203 of ceramic deposition ring 202. It is expected that silicon carbide grit blasting has a similar effect on the ceramic as diamond tool grinding, as grit particles impact and may even become embedded in the ceramic surface. Therefore, stresses created within the ceramic deposition ring 202 due to tensile forces applied by the pulling of the tantalum layer 206 and aluminum layer 204 as they separate from the ceramic 202 are expected to further increase the depth and the extent of the microcracking 205, as shown in FIG. 2C.

There is a need for a method of roughening a ceramic surface which promotes adherence of the sacrificial aluminum layer 204 to the surface 203 of the ceramic deposition ring 202, while minimizing types of damage which promote initiation of or increase in the cracking of the ceramic surface. It is well established that sharp reentrant corners in the surface or outer layers of a brittle material can be sites of crack initiation under stress conditions.

SUMMARY OF THE INVENTION

We have discovered a method of roughening a ceramic surface in which mechanical interlocks are formed in the ceramic surface (such as an aluminum oxide surface) by chemical etching, thermal etching, or using a laser micromachining process. The method of the invention results in an effectively roughened ceramic surface which provides good adherence to an overlying sacrificial layer (such as aluminum), while minimizing microcracking and other damage to the ceramic surface. Because there is essentially no chemical bonding between the ceramic and an overlying, typically metal sacrificial layer, the method of the invention functions by enlarging the contact area between the ceramic surface and the sacrificial layer, and mechanically locking the sacrificial layer to the ceramic surface.

The mechanical interlocks in the ceramic surface are typically, and not by way of limitation, formed by 1) pattern etching the ceramic surface through a mask using a chemical etchant, or 2) a thermal etching process, or 3) using a laser system which includes optics for producing a patterned beam. The ceramic surface which has mechanical interlocks formed therein may be used for a number of different applications within semiconductor processing equipment when it is desired to improve the adherence of a layer of material applied over the ceramic surface. A particular application of the invention is a deposition ring for use within a physical vapor deposition chamber, where an upper surface of the deposition ring has mechanical interlocks formed therein by chemical etching, thermal etching, or laser micromachining.

DETAILED DESCRIPTION OF THE PREFERRED EMBODIMENTS

Disclosed herein is a method of roughening a ceramic surface by forming mechanical interlocks in the ceramic surface by chemical etching, thermal etching, or using a laser micromachining process. The method is applicable for promoting adherence of an overlying layer to an underlying ceramic surface for use in semiconductor processing chambers. To illustrate the invention, applicants describe the invention with reference to use in a physical vapor deposition (PVD) chamber. The ceramic surface has mechanical interlocks formed therein by chemical etching, thermal etching, or laser micromachining. Exemplary processing conditions for performing the method of the invention are set forth below.

As a preface to the detailed description, it should be noted that, as used in this specification and the appended claims, the singular forms "a", "an", and "the" include plural referents, unless the context clearly dictates otherwise.

I. Method of Roughening a Ceramic Surface

The present invention is a method of roughening a ceramic surface by forming mechanical interlocks therein. The ceramic may be any ceramic material known in the art, depending on the particular end use application of the roughened ceramic surface. For use within a semiconductor processing chamber, preferred ceramic materials include alumina, quartz, alumina/quartz mixtures (e.g., mullite), aluminum nitride, silicon carbide, silicon nitride, and boron carbide, by way of example and not by way of limitation.

Formation of mechanical interlocks in the ceramic surface can be performed using either a chemical etching process, a thermal etching process, or a laser micromachining process.

Figure 3A:
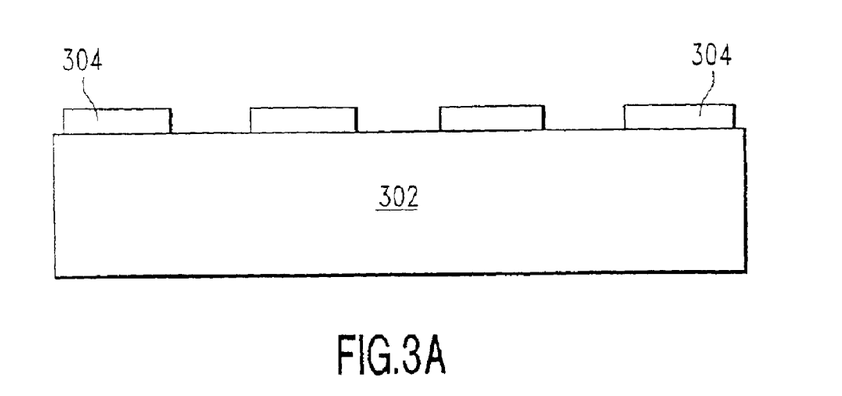
FIGS. 3A–3C are cross-sectional schematic views illustrating an exemplary method of the invention for forming mechanical interlocks in a ceramic surface using a chemical etching process.
Figure 3B:
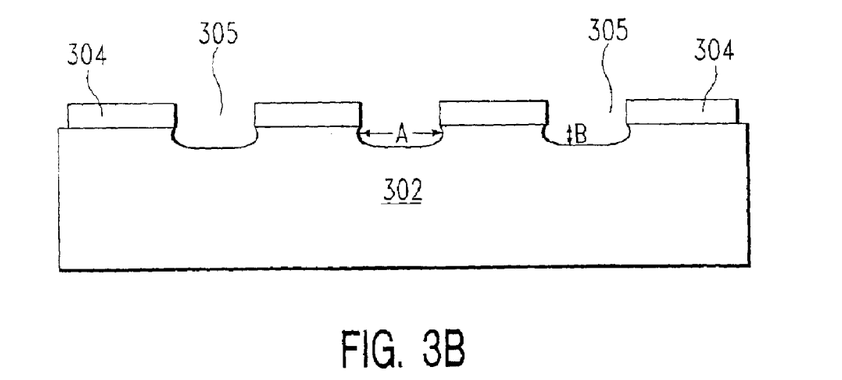
Figure 3C:
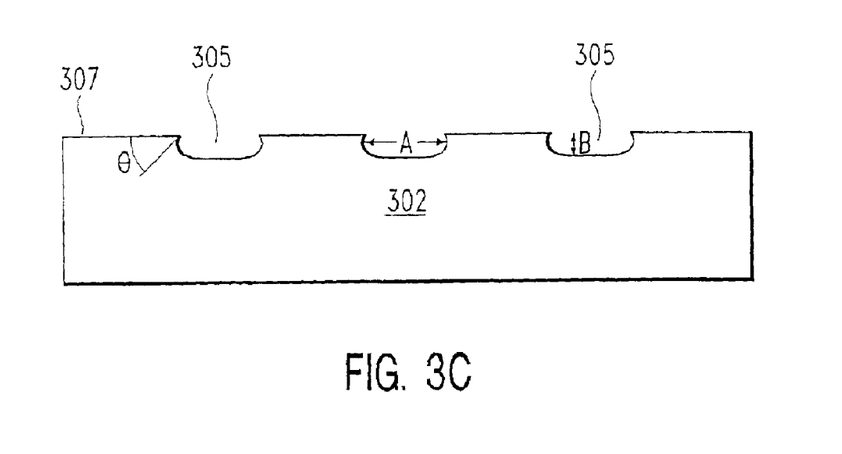

FIGS. 3A–3C illustrate a particular embodiment of the invention for forming mechanical interlocks in a ceramic surface using a chemical etching process. The first step of the process is the formation of a patterned mask 304 on the ceramic surface 302, as shown in FIG. 3A. The patterned mask 304 may take a variety of forms. Several alternatives include a conformal elastomeric mask which is adhesive-bonded or clamped to the ceramic surface 302; a rigid metal mask that is close-fitting to the ceramic surface 302; or a thin metal coating that has been patterned with openings by a metal removal process, such as etching. Openings in the mask 304 can be formed using a plasma etching process, laser micromachining process, conventional machining, or photoengraving (by way of example and not by way of limitation).

Referring to FIG. 3B, the ceramic layer 302 is pattern etched to create mechanical interlocks 305 in the ceramic surface. If a chemical etching process is used to form the mechanical interlocks in the ceramic surface 302, the preferred etch chemistry will depend on the chemical properties of the particular ceramic being etched, as well as the particular mask used. The chemical etchant is typically an acidic or basic solution, such as 100% $H_2SO_4$ (at about 230° C.), 85% $H_3PO_4$ (at about 350–420° C.), 1:1 $H_2SO_4/H_3PO_4$ (at about 270–300° C.), 10% HF (at about 20° C.), molten $K_2S_2O_4$ (at 650° C.), molten $V_2O_5$ (at about 900° C.), molten $Na_2B_4O_7$ (at about 850–900° C.), or nonaqueous KOH (at about 335° C.). The chemical etchant is generally selected to provide an undercut etch profile, as shown in FIG. 3B.

The amount of time that the ceramic is immersed in the etching solution depends on the particular ceramic, the type and concentration of the etchant solution, and the desired size of the interlocks. If the ceramic is alumina and the etchant solution is 1:1 $H_2SO_4/H_3PO_4$, an immersion time within the range of about 10 minutes to about 60 minutes, at a temperature of about 270° C. to about 300° C., will typically provide interlocks having a desirable profile and dimensions.

The size of the mechanical interlocks 305 will depend on the process used to form the interlocks. The process will be designed to give the amount of surface area desired. When a wet chemical etching process is used to form the mechanical interlocks in alumina, the interlocks 305 produced typically have a diameter A of about 30 $\mu$m to about 300 $\mu$m; more typically, about 30 $\mu$m to about 200 $\mu$m. Interlocks having a diameter within the range of about 50 $\mu$m to about 100 $\mu$m work particularly well. The depth B of interlocks 305 is typically within the range of about 1 $\mu$m to about 40 $\mu$m, and the diameter to depth ratio (A:B) is typically within the range of about 5:1 to about 50:1. When a wet chemical etching process is used to form the mechanical interlocks, the spacing between adjacent interlocks is typically within the range of about 200 $\mu$m to about 700 $\mu$m; more typically, about 200 $\mu$m to about 500 $\mu$m.

The interlocks 305 are preferably formed to have an undercut profile, as shown in FIG. 3B. The undercut profile provides improved interlocking and adherence between the ceramic surface 302 and a subsequently deposited sacrificial material layer. The degree of undercutting should be sufficient to produce a mechanical lock on the layer of sacrificial material layer after it has cooled and shrunk to its dimensions at room temperature. With reference to FIG. 3C, when a chemical etching process is used to form the interlocks, the angle θ formed between the wall 306 of the interlock 305 and the surface 307 of the ceramic is typically within the range of about 45° to about 87°. The shape of the undercut and the spacing on the ceramic surface between adjacent undercuts should be such that combined stresses created within the surrounding ceramic structure are substantially compressive when tensile loading is imposed on the interface between the ceramic surface and the sacrificial material layer.

Referring to FIG. 3C, after pattern etching of the ceramic has been completed to the desired etch depth, the patterned mask 304 is removed. Removal of the patterned mask 304 can be performed using conventional techniques, depending on the particular mask used.

According to a particular embodiment of the invention, a layer of a metal having a high melting temperature (such as copper or nickel) is sputter deposited onto the ceramic surface to a thickness of about 10 $\mu$m to about 50 $\mu$m. An e-beam is used to drill holes through the metal coating and, typically, partially into the ceramic. Care must be taken not to use too much energy during the mask patterning process, to avoid cracking of the ceramic. By way of example, the ceramic surface is then pattern etched through the metal masking layer by immersion in molten sodium tetraborate ($Na_2B_4O_7$) at a temperature of 850–900° C. for about 10 minutes to about 60 minutes. The copper masking layer is then stripped by immersion of the ceramic surface in an acid bath. For example, the copper masking layer may be stripped by immersing the ceramic surface in an HCl bath for about 1 minute to about 5 minutes at room temperature. The ceramic surface is then cleaned by rinsing with deionized water.

In an alternative embodiment, a sheet of a metal having a high melting temperature (such as copper or nickel) having a thickness of about 25 $\mu$m to about 250 $\mu$m is masked and etched to form numerous small openings. The metal sheet is then formed to fit the ceramic surface. The metal sheet is then coated with layer of an intermediate transition brazing material having a thickness of about 25 $\mu$m to about 125 $\mu$m, so that the transition material does not fill the holes in the metal sheet. Suitable intermediate transition brazing materials include mixtures of molybdenum, manganese, molybdenum oxide, and copper, of the kind described by Claes I. Helgesson in *Ceramic to Metal Bonding* (Boston Technical Publishers: Cambridge, Mass. (1968), p. 11). The coated metal sheet is then fitted to the ceramic surface and furnace brazed. By way of example, the ceramic surface is then pattern etched through the metal masking layer by immersion in molten sodium tetraborate ($Na_2B_4O_7$) at a temperature of 850–900° C. for about 10 minutes to about 60 minutes. The copper masking layer is then stripped by immersion of the ceramic surface in an acid bath. For example, the copper masking layer may be stripped by immersing the ceramic surface in an HCl bath for about 1 minute to about 5 minutes at room temperature. The ceramic surface is then cleaned by rinsing with deionized water.

In a third embodiment, a layer of a metal having a high melting temperature (such as copper or nickel) is sputter deposited onto the ceramic surface to a thickness of about 50 $\mu$m to about 250 $\mu$m. A fine spiral or concentric groove pattern is machined into the metal layer and partially into the ceramic surface. By way of example, the ceramic surface is then pattern etched through the metal masking layer by immersion in molten sodium tetraborate ($Na_2B_4O_7$) at a temperature of 850–900° C. for about 10 minutes to about 60 minutes. The copper masking layer is then stripped by immersion of the ceramic surface in an acid bath. For example, the copper masking layer may be stripped by immersing the ceramic surface in an HCl bath for about 1 minute to about 5 minutes at room temperature. The ceramic surface is then cleaned by rinsing with deionized water.

In yet another embodiment, a layer of a high melting temperature metal (such as copper or nickel) is sputter deposited onto the ceramic surface to a thickness of about 2 $\mu$m to about 10 $\mu$m. A fine spiral or concentric groove pattern is machined into the metal layer using electric discharge machining (EDM), including a system of electrode motion control that enables the electrode to follow contours of the metal coating. By way of example, the ceramic surface is then pattern etched through the metal masking layer by immersion in molten sodium tetraborate ($Na_2B_4O_7$) at a temperature of 850–900° C. for about 10 minutes to about 60 minutes. The copper masking layer is then stripped by immersion of the ceramic surface in an acid bath. For example, the copper masking layer may be stripped by immersing the ceramic surface in an HCl bath for about 1 minute to about 5 minutes at room temperature. The ceramic surface is then cleaned by rinsing with deionized water.

The metal masking/chemical etching embodiment processes described above may also be used with masking metals other than copper and chemical etchants other than sodium tetraborate, provided that the masking metal and chemical etchant are both selected so that the metal is sufficiently resistant to etching by the particular chemical etchant that the metal layer can perform the necessary masking function. In any case, the masking metal must be able to be completely removed from the ceramic surface, or must be compatible with the particular end use application of the texturized ceramic surface. For example, in the production of a component for use within a semiconductor processing chamber, there may be some instances in which the use of a copper mask is not desirable because the presence of residual copper in the processing chamber will negatively affect semiconductor manufacturing processes performed in that chamber.

In an alternative embodiment of the invention, a thermal etching process is used to form the mechanical interlocks in the ceramic surface. Thermal etching can be used to texturize the surface of any polycrystalline ceramic, such as alumina, silicon carbide, and aluminum nitride (by way of example and not by way of limitation). During thermal etching, a portion of the binding agent (examples of various binding agents include silica, calcium oxide, and magnesium oxide) at the surface of the ceramic is partially removed, exposing the grain structure of the ceramic. The binding agent typically has a higher vapor pressure than the ceramic, causing the binding agent on the surface of the ceramic to volatilize and leave the ceramic surface when the ceramic is exposed to a temperature slightly below the sintering temperature of the ceramic. Thermal etching is typically performed by exposing the ceramic to a temperature about 200° C. to about 500° C. below the sintering temperature, for a time period of about 20 minutes to about 6 hours. For example, thermal etching of alumina is typically performed at a temperature within the range of about 1250° C. to about 1500° C., for a time period of about 30 minutes to about 4.5 hours. The amount of time is empirically determined so that the alumina crystals remain bound to the surface of the ceramic structure, while crevices are created between the crystal grains.

Figure 4:
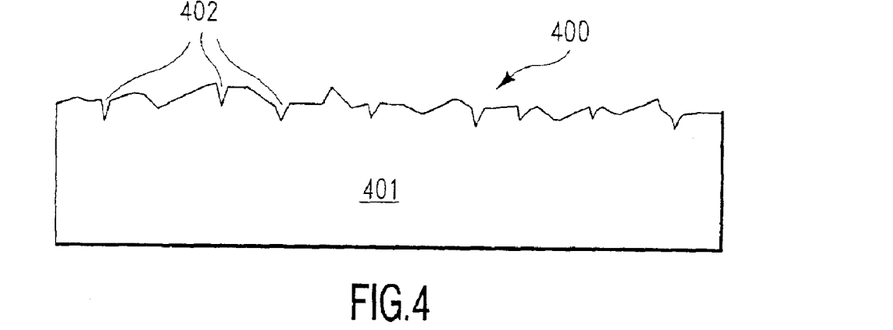
FIG. 4 is a cross-sectional schematic view of a structure 400 showing grooves 402 which have been formed in a ceramic surface 401 using a thermal etching process, as described herein.

In order to enlarge the contact area, while avoiding microcracking of the ceramic, the amount of binding agent removed should be less than about 50% of the average grain size of the particular ceramic being etched. For example, when the ceramic is alumina, with an average grain size of about 6 μm to about 10 μm, the binding agent should be removed to a depth of no more than about 2 μm to about 5 μm. Referring to FIG. 4, thermal etching results in the formation of grooves 402 at the grain boundary phase of the ceramic surface 400. The pattern formed is an artifact of the grain structure of the particular ceramic being etched. The spacing between the grooves or divots in the ceramic will be approximately equal to the grain size of the ceramic.

After thermal etching, the ceramic surface may be ultrasonically cleaned to remove any loosely bound ceramic particles. Ultrasonic cleaning can be performed by immersing the ceramic surface in an ultrasonic bath of deionized water, at a temperature of about 20° C. to about 80° C., for a time period of about 10 minutes to about 1 hour.

After cleaning, the ceramic surface is then masked to cover portions of the surface where a thermal spray coating is to be applied later. The unmasked portion of the ceramic surface may be re-ground or lapped to provide the desired surface finish.

In a third embodiment of the invention, a laser system which includes optics for producing a patterned beam is used to form mechanical interlocks in the ceramic surface. The laser is preferably a high power, UV pulsed laser system, which is capable of drilling precise holes of the desired depth, without significant heating of or damage to the ceramic surface. Laser systems suitable for use in the present method include, but are not limited to, an excimer laser system (for example, Model No. LPX210i, available from Lambda Physik USA, Inc., Fort Lauderdale, Fla.) and a diode pumped solid state laser system (for example, Model No. PG355-10-F10, also available from Lambda Physik).

The laser micromachining process typically involves the application of a high power, UV pulsed laser beam. The laser beam is focused at a point on a workpiece where a hole is to be formed. Material at the focused area of the workpiece is transformed into liquid and vapor phases due to sufficient high temperature. The desired hole is then formed, pulse-by-pulse, by removal of material in the liquid and vapor phases. During a 10–30 nanosecond pulsed laser operation, the transformation of material from the solid phase to the liquid phase, then vapor phase, is so rapid that there is virtually no time for heat to be transferred into the body of the workpiece. As such, the use of a high power, UV pulsed laser beam effectively minimizes the size of the area on the workpiece which is affected by heat during the laser micromachining process, thereby minimizing microcracking. The use of a laser beam with a longer wavelength than 400 nm and/or a longer pulse time can lead to significant heat conduction into the workpiece, resulting in poor surface morphology and, potentially, microcracking.

When a laser micromachining process is used to form the mechanical interlocks, the interlocks are typically formed to have a diameter of about 30 μm to about 100 μm and a depth of about 10 μm to about 50 μm. The diameter to depth ratio of laser micromachined interlocks is typically within the range of about 2:1 to about 3:1. The spacing between adjacent interlocks is typically within the range of about 200 μm to about 700 μm.

Figure 5:
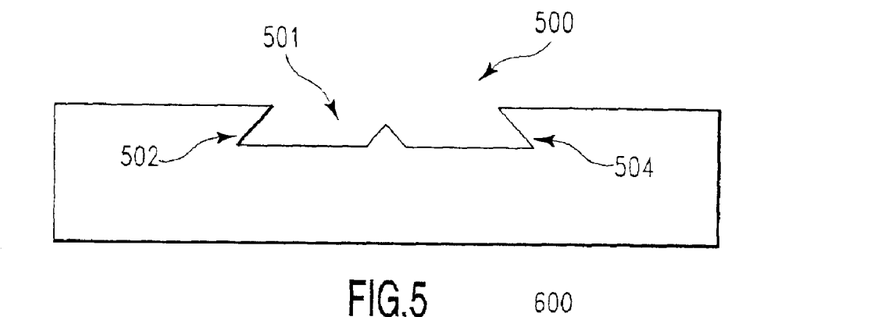
FIG. 5 is a cross-sectional schematic view of a structure 500 showing two 502, 504 of the four lobes of a laser-drilled cavity 501 comprising four cavities. Each of the four separate cavities has one wall cut at an angle other than 90° to the surface of the ceramic. The four cavities are arrayed at 90° to each other and intersect in the middle to create a single, four-lobed cavity.

A laser-drilled cavity generally is cut at an angle other than 90° to the surface of the ceramic. When a laser micromachining process is used to form the interlocks, the angle between the wall of the cavity and the surface of the ceramic is typically within the range of about 30° to about 87°; more typically, within the range of about 60° to about 80°. FIG. 5 is a cross-sectional schematic view which is illustrative of a structure 500 which can be produced by laser micromachining. Shown in FIG. 5 are two 502, 504 of the lobes of a multi-lobed cavity 501 consisting of four cavities, each having one undercut wall, arrayed at an angle of 90° to each other and intersecting in the middle. Most of the walls of the four-lobed cavity 501 are undercut.

After formation of mechanical interlocks in the ceramic surface (either by chemical etching, thermal etching, or using a laser micromachining process), the ceramic surface can optionally be baked for outgasing purposes, and subsequently annealed to further relax surface stress. Annealing is typically performed by heating the ceramic to a temperature ranging from about 120° C. to about 300° C. for a time period of about 1 hour to about 4 hours. Annealing temperatures for particular ceramic materials are generally known in the art.

Figure 6:
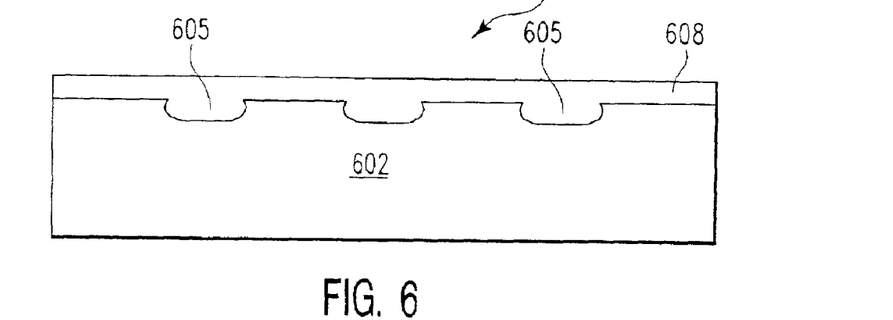
FIG. 6 is a cross-sectional schematic view of a structure 600 having a layer 608 of a sacrificial material deposited over ceramic surface 602 and filling mechanical interlocks 605.

Referring to FIG. 6, after formation of mechanical interlocks 605 in a ceramic surface 602, a layer 608 of a sacrificial material is typically deposited over ceramic surface 602. The sacrificial material layer 608 may be deposited using conventional techniques known in the art, depending on the particular sacrificial material used and the size of the mechanical interlocks 605, which will depend on the process by which the interlocks are formed. If the sacrificial material is aluminum and the interlocks were formed using a wet chemical etching process, the aluminum is typically deposited using a thermal spraying (aluminum arc spray) process, for example. However, if the diameter of the interlocks is about 30 μm or less (for example, if the interlocks were formed by plasma etching or by laser micromachining), it may be difficult to fill the interlocks by thermal spraying with aluminum. Therefore, for small (i.e., 30 μm diameter or less) interlock sizes, the sacrificial material (e.g., aluminum) is typically deposited either by sputtering or evaporation. Alternatively, the sacrificial material may be deposited by electroplating over a PVD or CVD (i.e., chemical vapor deposition) deposited aluminum seed layer.

The deposited thickness of the sacrificial material layer 608 will depend on the particular sacrificial material used. For example, if the sacrificial material is aluminum, sacrificial material layer 608 will typically be deposited to a thickness ranging from about 0.003" (about 76 μm) to about 0.060" (about 1.5 mm).

Figure 7:
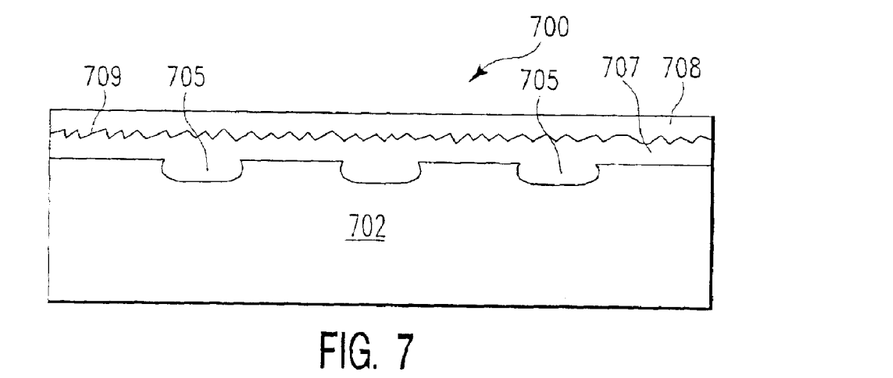
FIG. 7 is a cross-sectional schematic view of a structure 700 having a bond coat layer 707 deposited over ceramic surface 702 and filling mechanical interlocks 705. A layer 708 of a sacrificial material is deposited over bond coat layer 707.

FIG. 7 illustrates an alternative embodiment of the invention, in which a bond coat layer 707 is deposited on top of ceramic surface 702, prior to the deposition of sacrificial material layer 708. The purpose of bond coat layer 707 is to further improve the adherence of the sacrificial material layer 708 to the ceramic surface 702.

Bond coat layer 707 typically comprises a material having a linear coefficient of thermal expansion (CTE) which is no more than about 20% lower or higher than the CTE of the ceramic 702. For example, alumina has a CTE within the range of about $7.0 \times 10^{-6}$/° C. to $8.4 \times 10^{-6}$/° C. (typically, about $7.8 \times 10^{-6}$/° C.), depending on the composition and purity of the alumina. Suitable bond coat layer materials for use with alumina include tantalum (CTE=$6.5 \times 10^{-6}$/° C.), rhenium (CTE=$8.3 \times 10^{-6}$/° C.), chromium (CTE=$6.2 \times 10^{-6}$/° C.), titanium (CTE=$8.5 \times 10^{-6}$/° C.), platinum (CTE=$8.8-10^{-6}$/° C.), and combinations thereof. Molybdenum (CTE=$4.9 \times 10^{-6}$/° C.), nickel (CTE=$12.7 \times 10^{-6}$/° C.), and manganese (CTE=$21.2 \times 10^{-6}$/° C.) can be used in combination with any of the other bond coat layer materials listed above or with each other, to provide a desired nominal CTE. For example, mixtures of molybdenum and manganese (typically containing about 15 wt. % to about 25 wt. % manganese) can be tailored to have a desired nominal CTE.

If the bond coat material has a CTE that is lower than that of the ceramic material, the ceramic surface 702 and the bond coat layer 707 will interlock at application. As the temperature of the ceramic decreases during cooling, the bond between the ceramic and the bond coat layer becomes tighter. Therefore, in order to obtain the tightest bond possible between the bond coat layer 707 and the ceramic surface 702, the bond coat material should be deposited onto the ceramic surface at as high a ceramic surface temperature as possible. For example, if the ceramic is alumina, and the bond coat material is tantalum, the ceramic surface should be heated as high as about 1000° C.

If the bond coat material has a CTE that is higher than that of the ceramic material, a greater undercut may be required to insure that the ceramic surface 702 and the bond coat layer 707 remain interlocked.

If the ceramic has been texturized using a thermal etching process, the bond coat material will need to be selected to have the appropriate thermal coefficient of expansion and thermal properties so that the bond coat material will not introduce cracking in the ceramic. In particular, the bond coat material would need to be selected such that it does not have a high stress intermediary region in its stress vs. temperature curve that is associated with the temperatures that are achieved during subsequent aluminum arc spraying, which could cause the bond coat to expand to the point at which it would crack the ceramic (during or after the aluminum arc spray process).

The bond coat layer 707 can be deposited using standard techniques known in the art, depending on the particular bond coat material. For example, if the bond coat layer 707 is tantalum, the tantalum is typically deposited by physical vapor deposition (i.e., sputter deposition). The bond coat layer 707 is typically deposited to have a thickness ranging between about 0.0003" (about 7.6 $\mu$m) to about 0.0015" (about 38 $\mu$m).

In order to increase the adherence of the overlying sacrificial material 708 to the bond coat layer 707, the top surface 709 of the bond coat layer 707 is preferably roughened to a surface roughness of about 50 microinch Ra to about 400 microinch Ra prior to deposition of the sacrificial material layer 708. Roughening of the bond coat layer surface 709 can be effected by adjustment of various thermal spray parameters such as gas pressure, gas and powder feed rates, voltage, current, motion and direction of spray nozzle, mechanical surface roughening, gas chemistry, and powder components.

The structures shown in FIGS. 6 and 7 can be used as the surface of a component (such as a deposition ring) in a semiconductor processing chamber. When the amount of deposited tantalum builds up to an unacceptable level, the component can be removed from the semiconductor processing chamber, and the sacrificial material layer with overlying tantalum deposits can be removed using conventional techniques, depending on the sacrificial material used. For example, if the sacrificial material is aluminum, the aluminum layer and overlying tantalum deposits can be removed by immersing the surface of the chamber component in an acidic solution, such as 37% HCl, 93% $H_2SO_4$, 85% $H_3PO_4$, 70% $HNO_3$, 49% HF, 30% $H_2O_2$, or mixtures thereof. The immersion time will depend on the thickness of the aluminum layer 306. However, for an aluminum layer having a thickness within the range of about 0.006" (about 150 $\mu$) to about 0.015" (about 380 $\mu$m), an immersion time of about 5 minutes to about 20 minutes is typically sufficient to remove the entire aluminum layer and the overlying tantalum deposits.

If the chamber component includes an optional bond coat layer 707 between the ceramic surface 702 and the sacrificial material layer 708, the bond coat layer 707 should comprise a material which is either easily removable from the ceramic surface 702 (e.g., can be removed simultaneously with the removal of the sacrificial material layer 708), or is not removed, but is compatible with semiconductor manufacturing processes performed within the semiconductor processing chamber. Tantalum, which has a CTE slightly lower than that of alumina, is an excellent material for use as the bond coat layer 707. Because tantalum is highly resistant to chemical etchants (as described in the "Background of the Invention"), a tantalum bond coat layer 707 would typically not be removed during the removal of the sacrificial material layer 708 and overlying tantalum deposits.

After removal of the sacrificial material layer and tantalum deposits, the ceramic surface or bond coat layer is recoated with a layer of sacrificial material, as previously described.

Although less rough than grit-blasted ceramic surfaces, we have found that ceramic surfaces roughened according to the chemical etching, thermal etching, or laser micromachining methods of the invention are less brittle and exhibit less damage than ceramic surfaces which are roughened using conventional grit blasting techniques. Further, ceramic surfaces which have been roughened according to the methods of the invention provide better adherence of an overlying aluminum sacrificial layer than do grit-blasted ceramic surfaces. Because adherence of an aluminum coating to a ceramic surface relies essentially on mechanical adherence (rather than chemical bonding) of the aluminum to the ceramic, the present invention provides a solution to a fundamental problem by enlarging the contact area between the ceramic surface and the aluminum, and by mechanically locking the aluminum to the ceramic surface.

The above described preferred embodiments are not intended to limit the scope of the present invention, as one skilled in the art can, in view of the present disclosure expand such embodiments to correspond with the subject matter of the invention claimed below.

We claim:

1. A component for use within a semiconductor processing chamber, wherein said component has at least one ceramic surface which has patterned mechanical interlocks formed therein, wherein said patterned mechanical interlocks are undercut into said at least one ceramic surface using a process selected from the group consisting of pattern etching said ceramic surface through a mask using a chemical etchant, patterning etching said ceramic using a thermal etching process, and pattern etching said ceramic using a laser micromachining process which employs a laser system which includes optics for producing a patterned beam, and wherein an exterior surface layer of said component is a sacrificial coating which can be removed essentially without harming said ceramic surface and which has been applied over said ceramic surface containing said patterned mechanical interlocks.

2. The component of claim 1, wherein said ceramic is selected from the group consisting of alumina, quartz, aluminum nitride, silicon carbide, silicon nitride, boron carbide, and combinations thereof.

3. The component of claim 1, wherein said sacrificial exterior surface layer is aluminum.

4. The component of claim 3, wherein said aluminum layer has a thickness within the range of about 76 $\mu$m to about 1.5 mm.

5. The component of claim 1, wherein said component includes a bond coat layer between said ceramic surface and said sacrificial exterior surface layer.

6. The component of claim 5, wherein said bond coat layer comprises a material having a coefficient of thermal expansion which is no more than about 20% higher or lower than the coefficient of thermal expansion of said ceramic.

7. The component of claim 5, wherein said ceramic comprises alumina, and said bond coat layer comprises a material selected from the group consisting of tantalum, rhenium, molybdenum, chromium, titanium, platinum, nickel, manganese, and combinations thereof.

8. The component of claim 7, wherein said bond coat layer comprises tantalum, and said tantalum layer has a thickness within the range of about 7.6 $\mu$m to about 38 $\mu$m.

9. A deposition ring for use within a physical vapor deposition chamber, wherein said deposition ring has at least one ceramic surface which has patterned mechanical interlocks formed therein, wherein said patterned mechanical interlocks are undercut into said at least one ceramic surface using a process selected from the group consisting of patterned etching said ceramic surface through a mask using a chemical etchant, patterning etching said ceramic using a thermal etching process, and pattern etching said ceramic using a laser micromachining process which employs a laser system which includes optics for producing a patterned beam, and wherein an exterior surface layer of said deposition ring is a sacrificial coating which can be removed essentially without harming said ceramic surface and which has been applied over said ceramic surface containing said patterned mechanical interlocks.

10. The deposition ring of claim 9, wherein said ceramic is selected from the group consisting of alumina, quartz, aluminum nitride, silicon carbide, silicon nitride, boron carbide, and combinations thereof.

11. The deposition ring of claim 9, wherein said sacrificial exterior surface layer is aluminum.

12. The deposition ring of claim 11, wherein said aluminum layer has a thickness within the range of about 76 $\mu$m to about 1.5 mm.

13. The deposition ring of claim 9, wherein said deposition ring further includes a bond coat layer between said ceramic surface and said sacrificial exterior surface layer.

14. The deposition ring of claim 13, wherein said bond coat layer comprises a material having a coefficient of thermal expansion which is no more than about 20% higher or lower than the coefficient of thermal expansion of said ceramic.

15. The deposition ring of claim 13, wherein said ceramic comprises alumina, and said bond coat layer comprises a material selected from the group consisting of tantalum, rhenium, molybdenum, chromium, titanium, platinum, nickel, manganese, and combinations thereof.

16. The deposition ring of claim 15, wherein said bond coat layer comprises tantalum, and said tantalum layer has a thickness within the range of 7.6 $\mu$m to about 38 $\mu$m.

* * * * *